(12) United States Patent
Umemiya et al.

(10) Patent No.: US 7,923,905 B2
(45) Date of Patent: Apr. 12, 2011

(54) PIEZOELECTRIC ELEMENT AND METHOD FOR MANUFACTURING THE SAME

(75) Inventors: Shigeyoshi Umemiya, Kawasaki (JP); Masaharu Hida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 352 days.

(21) Appl. No.: 11/390,673

(22) Filed: Mar. 28, 2006

(65) Prior Publication Data
US 2007/0120447 A1 May 31, 2007

(30) Foreign Application Priority Data

Nov. 30, 2005 (JP) ................................ 2005-346792

(51) Int. Cl.
*H01L 41/053* (2006.01)
(52) U.S. Cl. ........................................ 310/344; 310/340
(58) Field of Classification Search ................... 310/366, 310/328, 340, 344
See application file for complete search history.

(56) References Cited

U.S. PATENT DOCUMENTS

| 5,757,250 | A | * | 5/1998 | Ichikawa et al. | ............... | 333/193 |
| 5,925,973 | A | * | 7/1999 | Eda et al. | ...................... | 310/348 |
| 6,930,438 | B2 | * | 8/2005 | Cramer et al. | ................. | 310/328 |
| 6,943,482 | B2 | * | 9/2005 | Bindig et al. | .................. | 310/328 |
| 2008/0274570 | A1 | * | 11/2008 | Suzuki et al. | .................... | 438/21 |

FOREIGN PATENT DOCUMENTS

| JP | 2002-074871 | * | 3/2002 |
| JP | 2003-061370 | * | 2/2003 |
| JP | 2003-284362 | * | 10/2003 |
| JP | 2004-030823 | * | 1/2004 |

OTHER PUBLICATIONS

Thongrueng et al.; "Lifetime and Degradation Mechanism of Multiplayer Ceramic Actuator", Jpn. J. Appl. Phys., vol. 37, pp. 5306-5310; Sep. 1998.

* cited by examiner

*Primary Examiner* — Derek J Rosenau
(74) *Attorney, Agent, or Firm* — Fujitsu Patent Center

(57) ABSTRACT

A coating film is formed on the whole surface area of a body part. Formation of the coating film may be done by immersing the body part in a solution of parfluoropolyether. Then, the parfluoropolyether constituting the coating film is joined with the side surfaces of the body part by irradiating Xenon excimer laser in a nitrogen atmosphere onto the side faces of the body part, or to the surface exposing an electrode layer. As a result, the protective film is formed only on the side surfaces of the body part. Thus, the protective film is formed as a monomolecular film. Total body part is then cleaned by 2,3-dihydrodecafluoropentane to remove non-reacted coating film, thereby completing a multi-layer piezoelectric element.

10 Claims, 16 Drawing Sheets

PIEZOELECTRIC ELEMENT AND METHOD FOR MANUFACTURING THE SAME

CROSS-REFERENCE TO RELATED APPLICATIONS

This application is based upon and claims the benefit of priority from the prior Japanese Patent Application No. 2005-346792, filed on Nov. 30, 2005, the entire contents of which are incorporated herein by reference.

BACKGROUND OF THE INVENTION

1. Field of the Invention

The present invention relates to a piezoelectric element suitable for rotary piezoelectric actuator and the like, and to a method for manufacturing the same.

2. Description of the Related Art

Information appliances are designed toward further downsizing and precision in recent years, which tendency increases the demand for actuators that achieve slight movement thereof. Those actuators require a piezoelectric element which can control movements of very small distances. Their applications include those for optical focal correction and tilt control, and for head of ink-jet printer or magnetic disk unit. Particularly for the magnetic disk units, their capacity increases year after year, and the requirement to increase the memory capacity per disk has increased. Accordingly, narrowing the track width of disk has become important. As a result, the small piezoelectric elements for the head actuators that increase the head positioning accuracy in the tracking direction are required to assure high reliability.

A piezoelectric element used in a head actuator of magnetic disk unit or the like generally has multi-layer structure as shown in FIG. 20. The piezoelectric element having that type of multi-layer structure is manufactured generally by the steps of sintering a stacked pile of green sheets 102 sandwiching an electrode layer 101 therebetween to integrate them, cutting them using a dicing saw or the like, and then forming an electrode 103 on each end face thereof. Regarding the piezoelectric element used in a head actuator of magnetic disk unit or the like, the thickness of each green sheet 102 is limited to several tens of micrometer to assure the desired displacement and owing to the dimensional limitation.

Furthermore, above-described head actuators are designed to decrease the applied voltage. To decrease the voltage, large displacement has to be attained while decreasing the applied voltage. For example, Patent Documents 1 through 3 disclose technologies to achieve the objective using materials having high piezoelectric constant.

On the other hand, there is significantly increased the intensity of electric field being applied along with the decreasing in voltage. In particular, the head actuators of magnetic disk units need a large control distance, which increases the intensity of electric field responding to the increased control distance. In addition, the head actuators are requested to have high reliability in a high temperature and high humidity environment because of their severe operating environments.

If, however, the head actuator adopts a conventional piezoelectric element shown in FIG. 20, continued operation thereof in a high temperature and high humidity environment extremely decreases the insulation resistance, and may lead to dielectric breakdown in a short time.

A cause of the phenomenon is conventionally presumed to be the exposure of the electrode layer 101, which constitutes the active part of the piezoelectric element. Based on the speculation, studies are conducted on the structure not exposing the electrode layer 101 and on the structure forming a resin protective film 125 to cover the electrode layer 101 on both side faces as shown in FIG. 21. Those structures, however, restrict the deformation of piezoelectric element because the portion not exposing the electrode and the resin protective film 125 act as a wall, thereby decreasing the magnitude of displacement, or narrowing the movable range.

In addition, there is a possible measure of forming a moisture-proof film over the whole surface area of the piezoelectric element. However, it becomes difficult for the piezoelectric element to adhere to the suspension and the slider on fabricating the magnetic disk unit owing to the high water repellency of the moisture-proof film.

There is another measure as described in Patent Document 4. According to the description, the whole surface area of a Head Gimbal Assembly (HGA) structured by fixing a piezoelectric element to a suspension and a slider is covered by a protective film. Although the measure forms the protective film also on the floating surface of the slider, the existence of fine irregularities on the floating surface prevents the formation of protective film uniformly along the profile of the irregular surface, thus making it difficult to adequately control the floating amount of slider above the magnetic disk. In addition, since the protective film is formed also on the magnetic head, the read-write characteristic of the magnetic signal fluctuates.

As described above, the piezoelectric elements of the related arts are difficult to assure high reliability on applying them to the magnetic disk units without inducing adverse effects.

Related arts are disclosed in:

Patent Document 1 (Japanese Patent Application Laid-open No. 2004-30823);

Patent Document 2 (Japanese Patent Application Laid-open No. 2003-284362);

Patent Document 3 (Japanese Patent Application Laid-open No. 2003-61370);

Patent Document 4 (Japanese Patent Application Laid-open No. 2002-74871); and

Non-Patent Document 1 (JJAP, vol. 37, pp. 5306-5310, (1998)).

SUMMARY OF THE INVENTION

An object of the present invention is to provide a piezoelectric element which can assure high reliability even on the application to a magnetic disk unit without inducing adverse effects thereon, and to a method for manufacturing thereof.

The piezoelectric element according to the present invention has a body part structured by alternately stacking a plurality of first electrode layers and a plurality of second electrode layers, and sandwiching a plurality of active layers between the first and second electrode layers. At least a portion of the first electrode layer and the second electrode layer sandwiching the active layer therebetween, on side face of the stacked layers, is covered with a monomolecular protective film.

In a method for manufacturing a piezoelectric element according to the present invention, a body part is formed, which is structured by alternately stacking a plurality of first electrode layers and a plurality of second electrode layers, and sandwiching a plurality of active layers between the first and Second electrode layers, and thereafter, a monomolecular protective film is formed which covers at least the portion of the first electrode layer and the second electrode layer sandwiching the active layer therebetween, on side face of the stacked layers.

When a direct current voltage or a pulse voltage accompanying bias voltage is continuously applied to a conventional piezoelectric element, migration likely occurs, and the migration is accelerated particularly in a high humidity environment. In migration state, electrode materials and the like diffuse from one electrode toward the other electrode. Under the same temperature condition, the insulation may deteriorate in a high humidity atmosphere within about 100 hours even though it operates normally in a dry atmosphere. Consequently, it is conceivable that the surface of a piezoelectric element may adsorb water molecules, thereby enhancing the deterioration of the element.

Accordingly, in the present invention, a monomolecular protective film is formed on at least a portion of the first electrode layer and the second electrode layer sandwiching the active layer therebetween, on side face of the stacked layers. As a result, the migration induced by the adhesion of water molecules is suppressed. Moreover, since the thickness of the monomolecular protective film is the thickness equivalent to a single molecule layer, the motion of piezoelectric element is not restricted. Furthermore, on applying the piezoelectric element to a magnetic disk unit, since there is no need of forming the monomolecular protective film at the portion for adhering to the suspension or the slider, the adverse effect on the motion of the magnetic disk unit is readily avoided.

DETAILED DESCRIPTION OF THE PREFERRED EMBODIMENTS

Figure 1A:
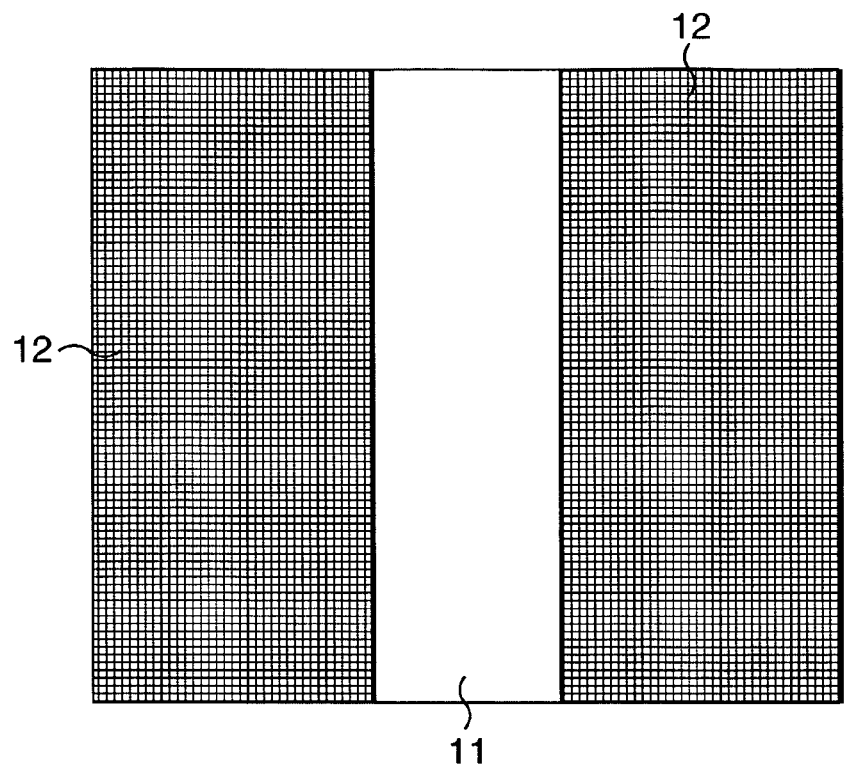
FIGS. 1A and 1B show plane views illustrating a method for manufacturing a multi-layer piezoelectric element according to an embodiment of the present invention.

Embodiments of the present invention are described in detail in the following referring to the drawings. For convenience, however, the structure of the multi-layer piezoelectric element is described herein together with a manufacturing method thereof.

According to an embodiment, first, an electrode layer 12 is selectively formed on a green sheet (piezoelectric ceramic layer) 11, as shown in FIG. 1A. The green sheet 11 may be the one containing, for example, $PbNi_{1/3}Nb_{2/3}O_3$ powder, $PbTiO_3$ powder, and $PbZrO_3$ powder. The thickness of the green sheet 11 is set to, for example, approximately from 20 to 30 μm. Formation of the electrode layer 12 is done by screen printing of Pt paste, for example. Incidentally, the Pt paste preferably contains $PbNi_{1/3}Nb_{2/3}O_3$ powder, $PbTiO_3$ powder, and $PbZrO_3$ powder by the total amounts approximately from 5 to 50% by volume, and more preferably approximately from 10 to 30% by volume. For example, about 20% by volume of these powders is added. These powders are contained to assure the high adhesion to the green sheet 11. Nevertheless, larger quantity of the powders may be added if the conductivity is secured, and smaller quantity thereof may be added if higher conductivity has to be secured. If, however, the powder content exceeds the upper limit of above numerical range, the conductivity likely becomes excessively low. If the powder content becomes lower than the lower limit, sufficient adhesion may not be attained.

Figure 1B:
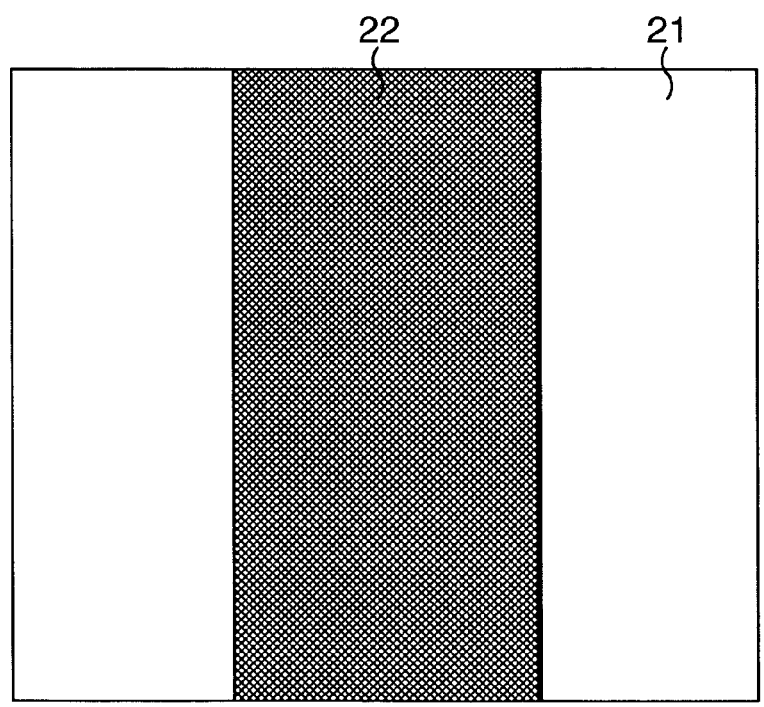

With a similar manner, an electrode layer 22 is selectively formed on a green sheet 21, as shown in FIG. 1B. The green sheet 21 is, for example, the same material with that used in the green sheet 11. The electrode layer 22 is formed by the same procedure and by using the same material as those of the electrode layer 12, for example. However, regarding the pattern of electrode layer 22, the succeeding step of overlaying the green sheet 11 and the green sheet 21 is conducted so as a part of the green sheet 11 to overlap a part of the electrode layer 21 in plane view.

According to the embodiment, two sets of the assembly of green sheet 11 and electrode layer 12 are prepared, and separately two sets of the assembly of green sheet 21 and electrode layer 22 are prepared. Formation of the electrode layer 22 on the green sheet 21 may be done before the formation of electrode layer 12 on the green sheet 11.

Figure 2:
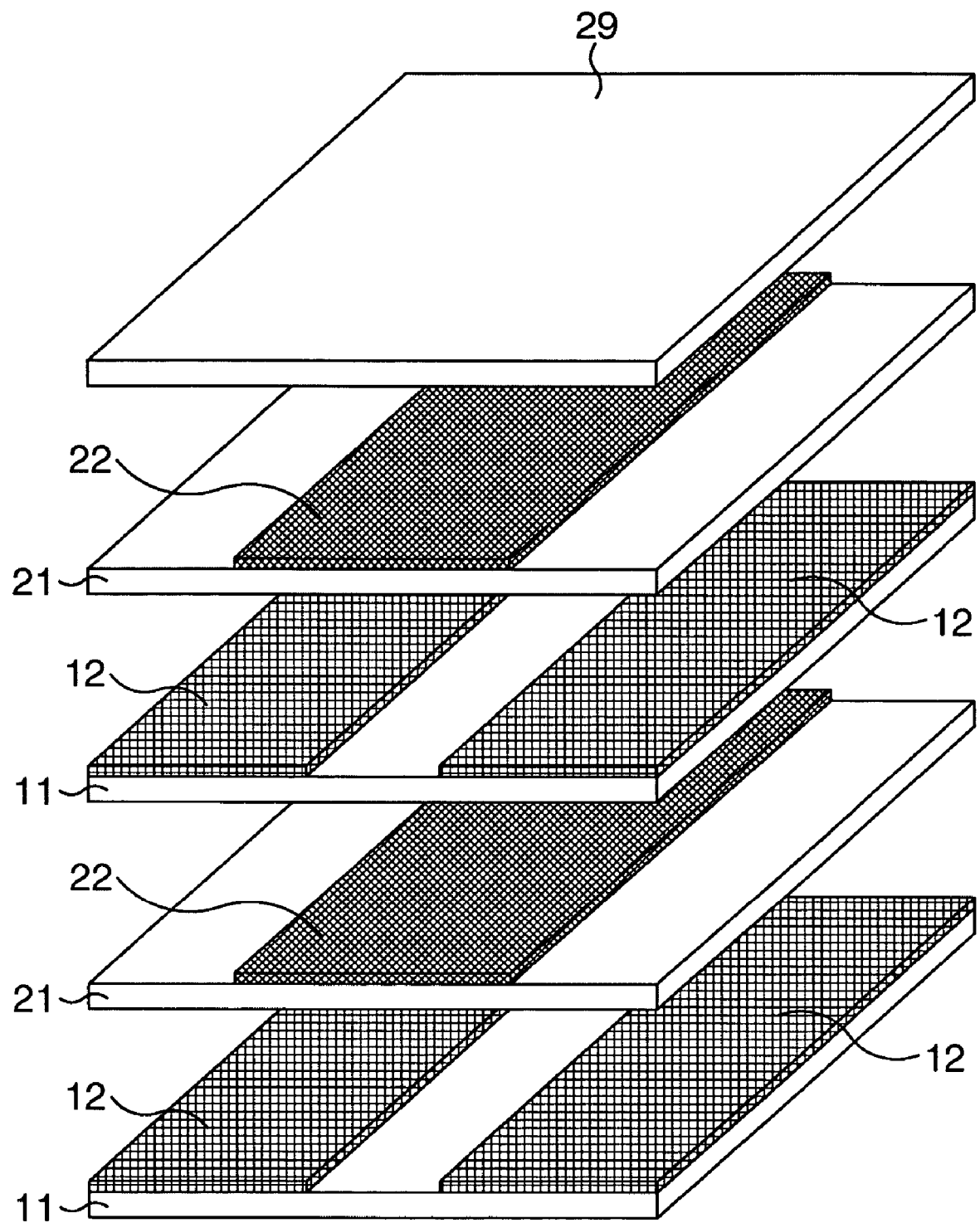
FIG. 2 shows, succeeding from FIG. 1A and FIG. 1B, a disassembled perspective view of the multi-layer piezoelectric element illustrating the method for manufacturing thereof.
Figure 3A:
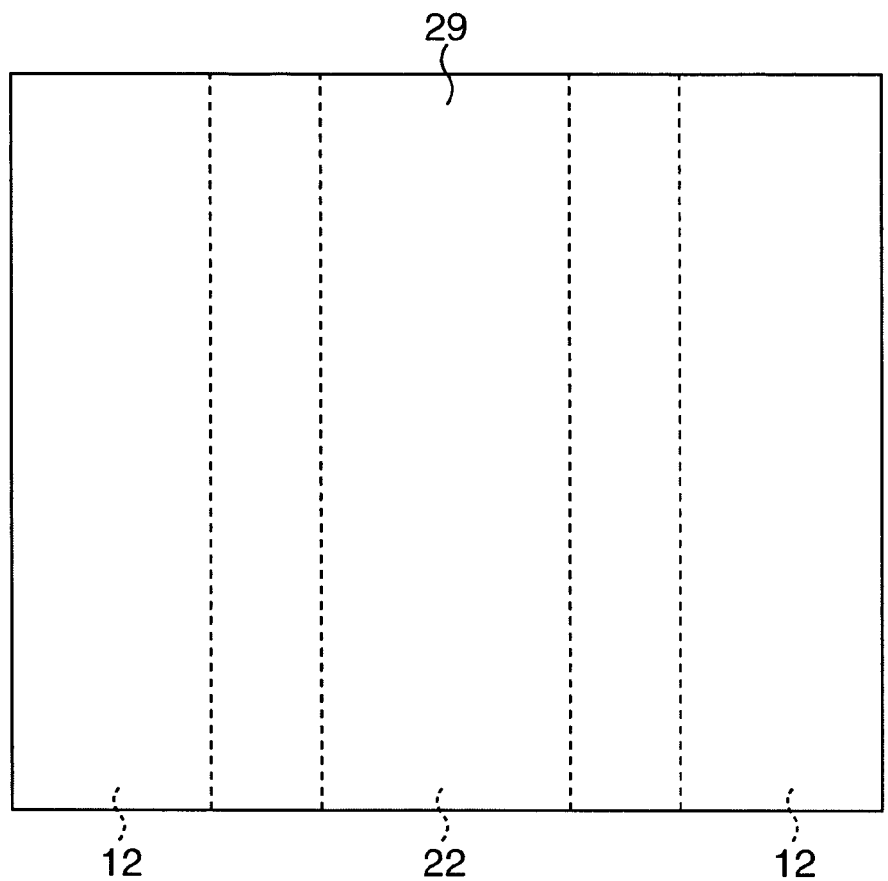
FIGS. 3A, 4A, and 5A show, succeeding from FIG. 2, plane views illustrating the manufacturing method of the multi-layer piezoelectric element in its process order.
Figure 3B:
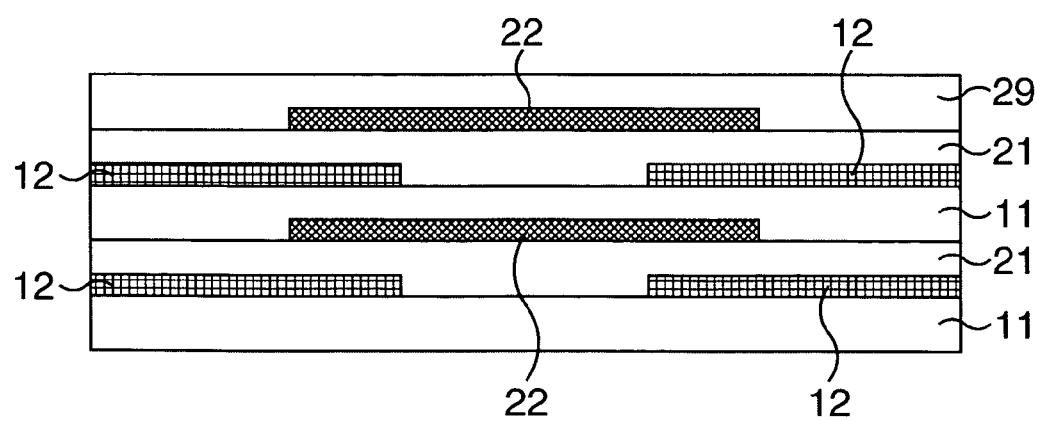
FIGS. 3B, 4B, and 5B show, succeeding from FIG. 2, front views illustrating the manufacturing method of the multi-layer piezoelectric element in its process order.

Then, as shown in FIG. 2, there are stacked, in an order from up to bottom, a green sheet 29, the green sheet 21 having the electrode layer 22 formed thereon, the green sheet 11 having the electrode layer 12 formed thereon, the green sheet 21 having the electrode layer 22 formed thereon, and the green sheet 11 having the electrode layer 12 formed thereon. The green sheet 29 may be the same as the green sheet 11 and the green sheet 21. After that, degreasing of the stacked sheets is given in air to remove organic ingredients in the green sheets 11, 21, and 29. Then, sintering of the stacked sheets is given in air to obtain an integrated multi-layer piezoelectric substrate, as shown in FIG. 3A and FIG. 3B. The sintering temperature is set to about 1050° C., for example.

Figure 4A:
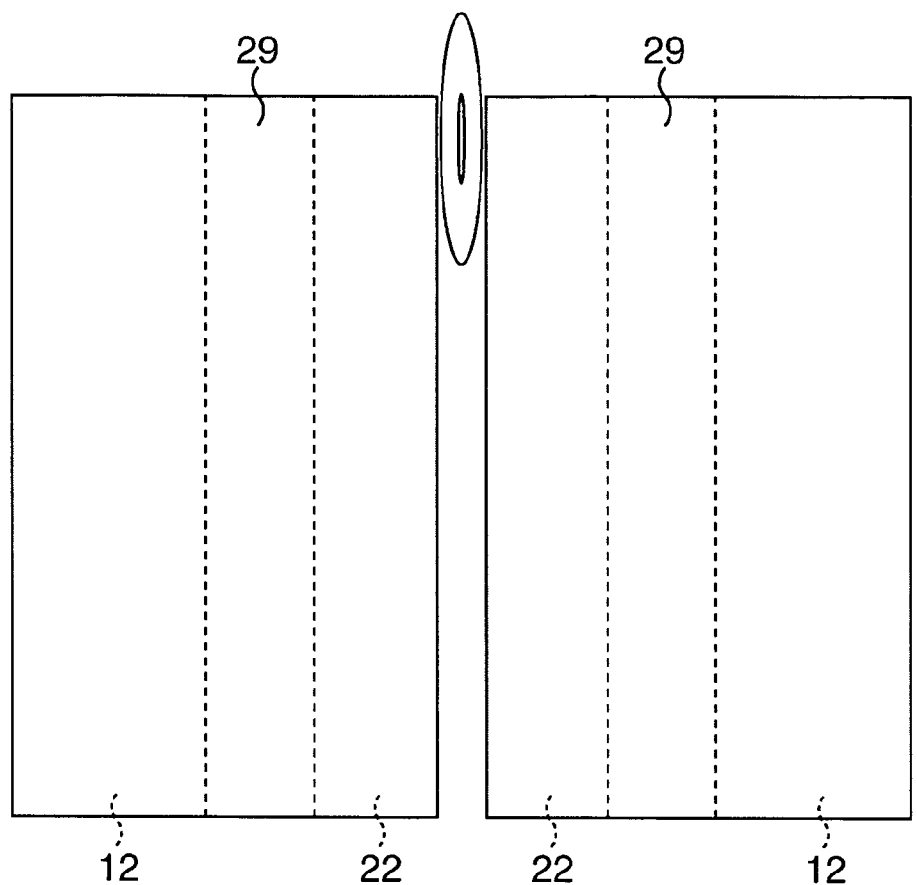
Figure 4B:
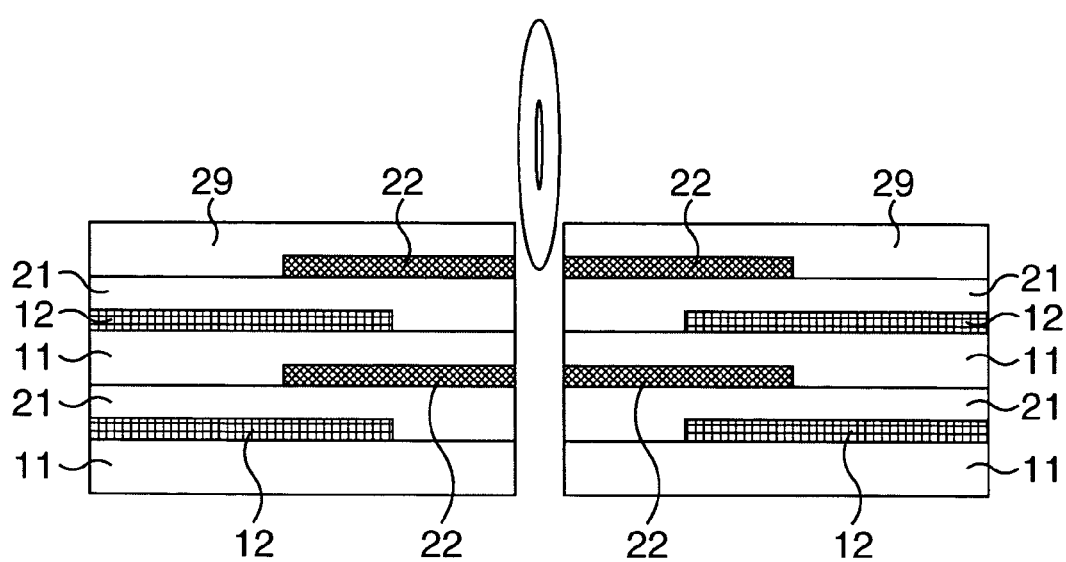

The next step is to mount the multi-layer piezoelectric substrate to a jig, and to divide the substrate into two pieces using a dicing saw or the like, as shown in FIG. 4A and FIG. 4B. The direction of cutting line is parallel to the extending direction of the electrode layers 12 and 22.

Figure 5A:
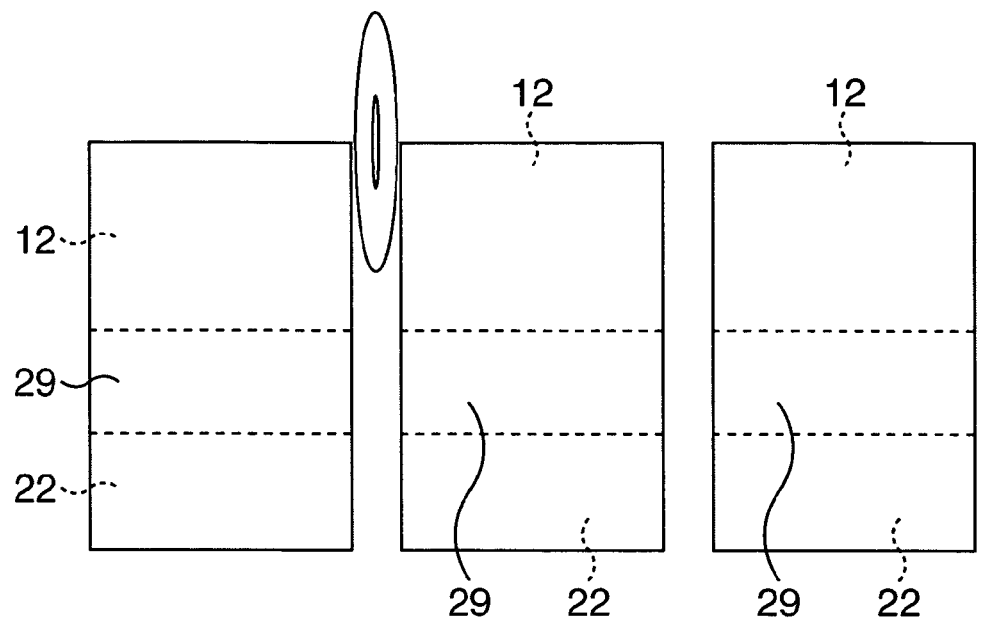
Figure 5B:
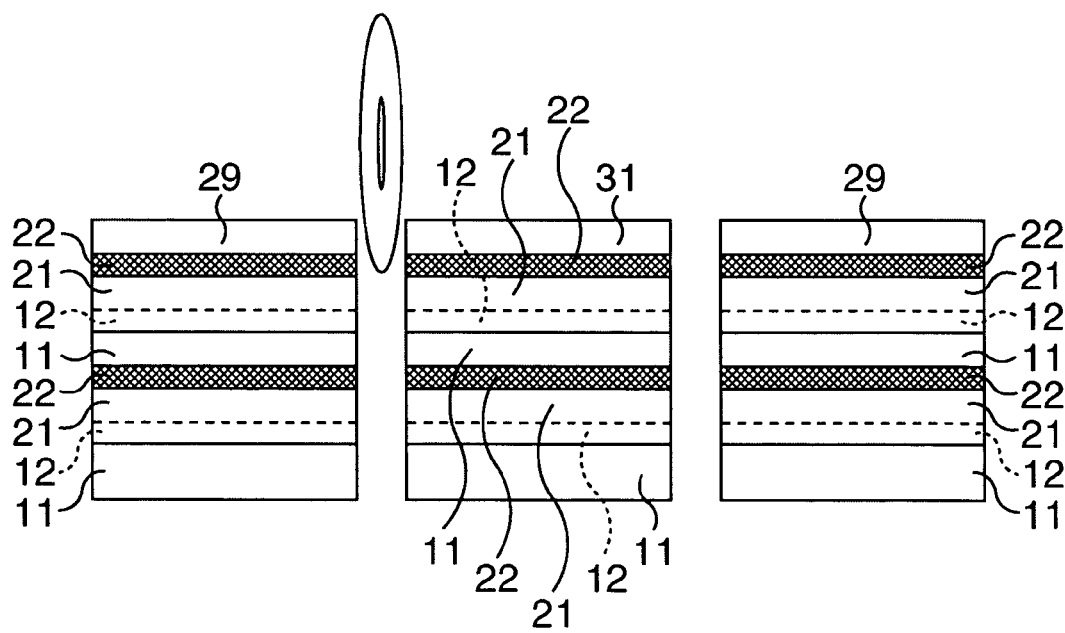
Figure 6:
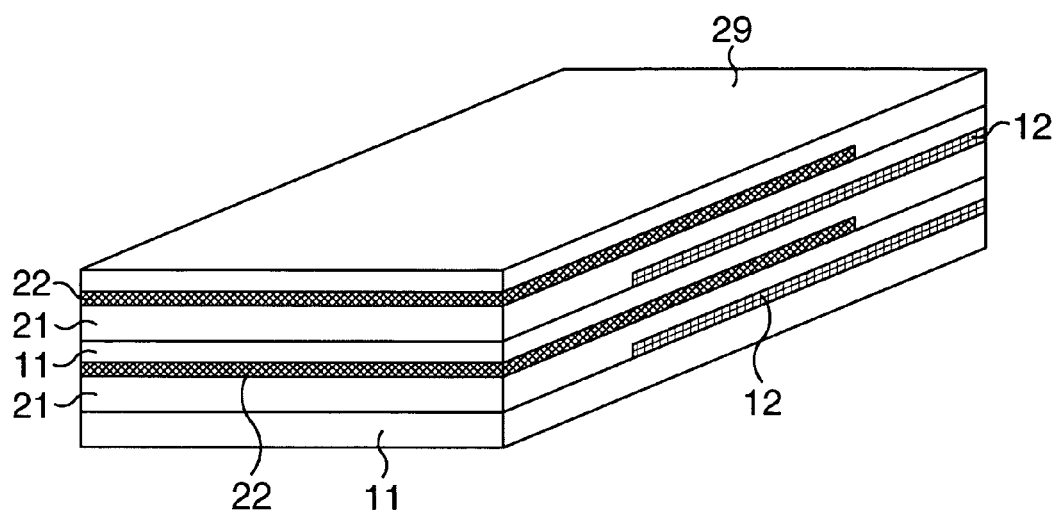
FIGS. 6 to 10 show, succeeding from FIG. 5A and FIG. 5B, perspective views illustrating the manufacturing method of the multi-layer piezoelectric element.

The succeeding step is to divide each of the two pieces of multi-layer piezoelectric substrate further into three pieces, as shown in FIG. 5A and FIG. 5B. The direction of cutting line is perpendicular to the extending direction of the electrode layers 12 and 22. As a result, six multi-layer piezoelectric substrates (stacked body) are obtained. Each of thus obtained multi-layer piezoelectric substrates is in a substantially rectangular parallelepiped shape, as shown in FIG. 6.

Figure 7:
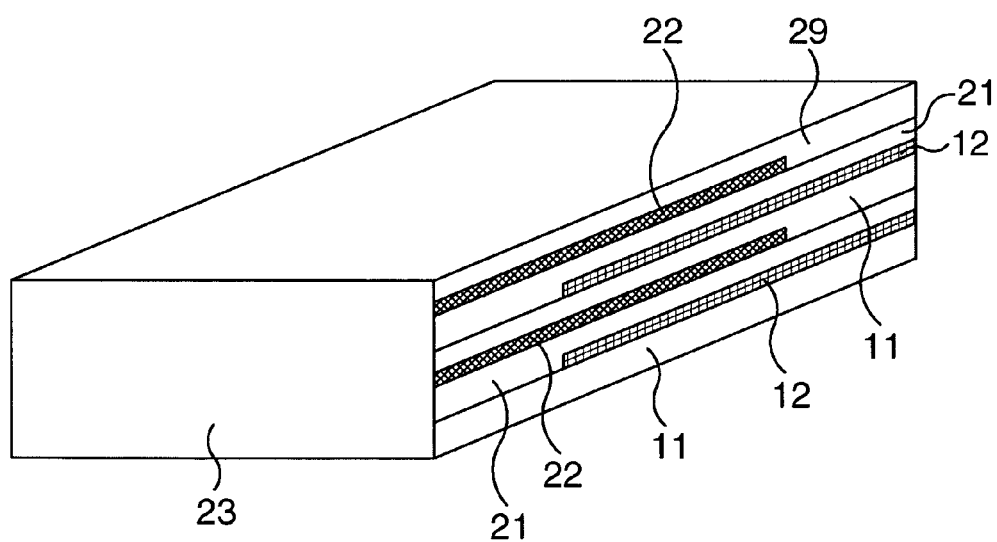

In the embodiment, thereafter, there are formed an electrode 23 which connects the electrodes 22 with each other, and another electrode 23 which connects the electrodes 12 with each other, on the respective side faces in the longitudinal direction of each multi-layer piezoelectric substrate, as shown in FIG. 7. Thus, the body part is fabricated. Formation of the electrodes 23 may be done by sputtering process, vapor deposition process or the like.

Figure 8:
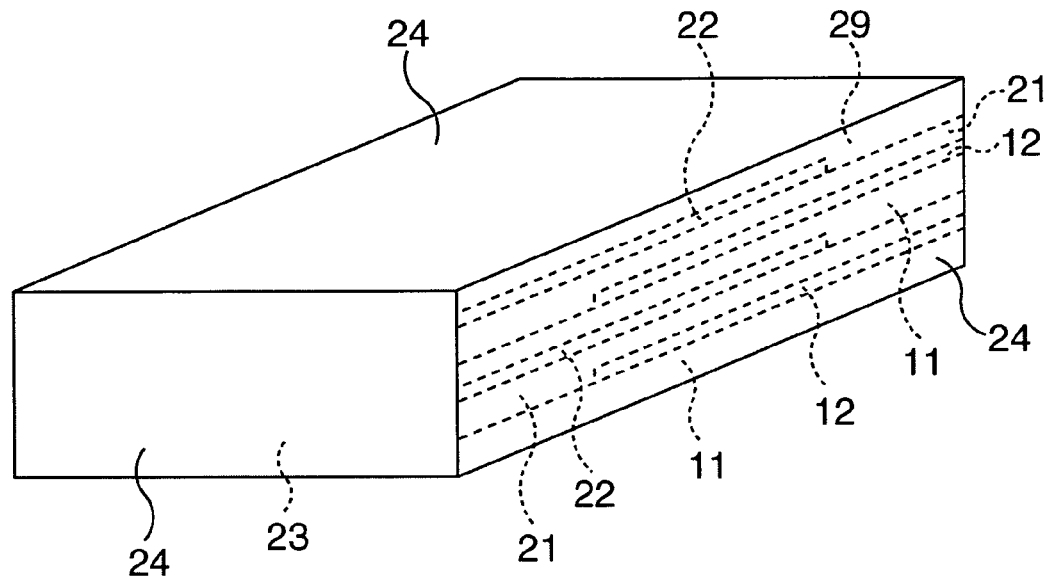

After that, as shown in FIG. 8, a coating film 24 is formed over the whole surface area of the substrate. Formation of the coating film 24 may be done by immersing the body part in a solution of parfluoropolyether, for example.

Figure 9:
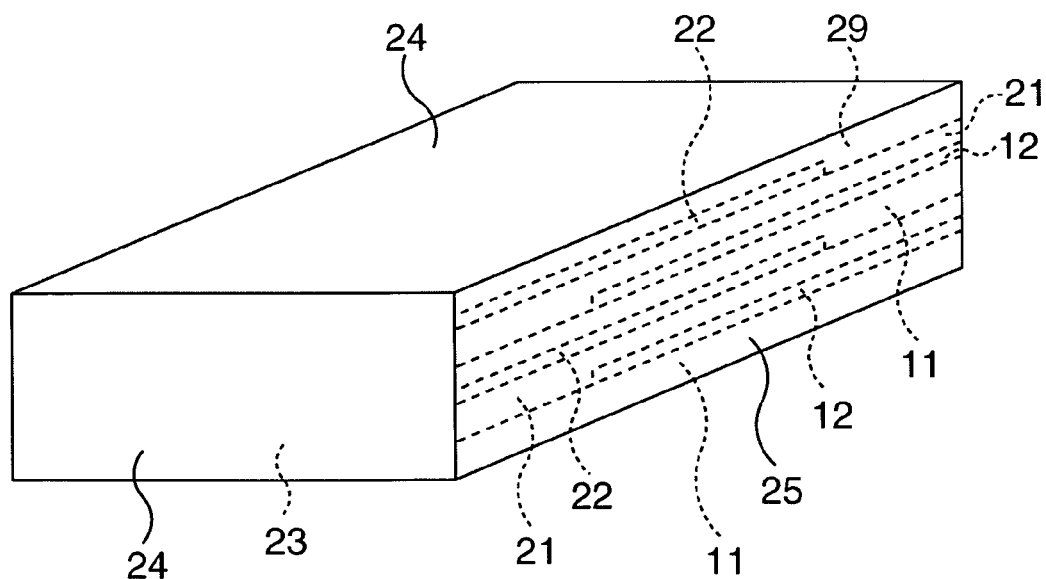

Then, in a nitrogen atmosphere, a Xenon excimer laser is irradiated onto the side faces of the body part, or the faces exposing the electrodes 12 and 22, respectively, thereby joining the side faces of body part with the parfluoroether which constitutes the coating film 24. As a result, as shown in FIG. 9, a protective film 25 is formed only on the side faces of the body part. The protective film 25 is formed in a form of monomolecular film.

Figure 10:
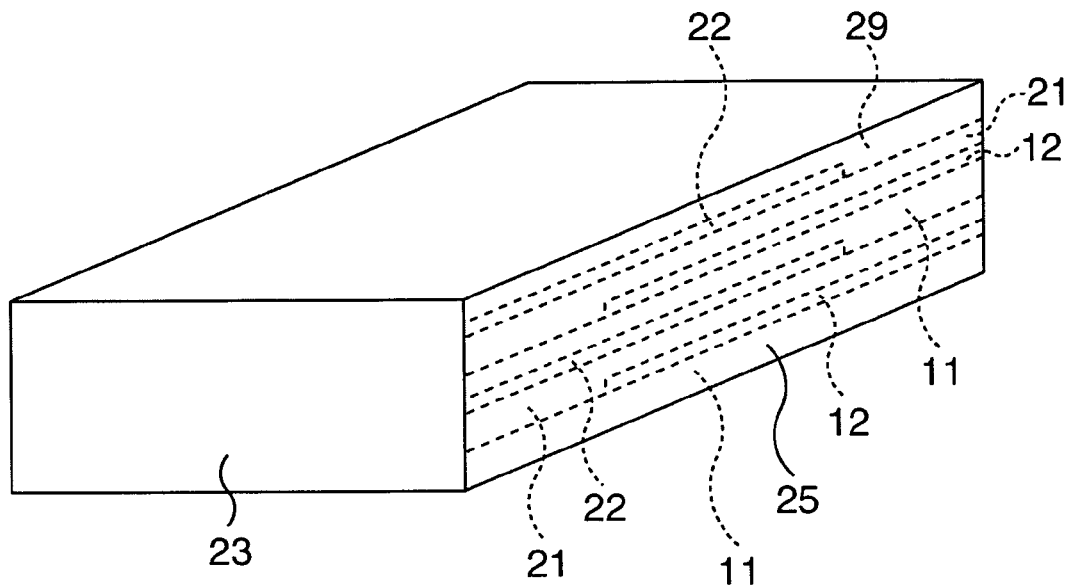

Succeedingly, the whole surface area of the body part is cleaned by 2,3-dihydrodecafluoropentane to remove the non-reacted coating film 24, as shown in FIG. 10. The step completes the multi-layer piezoelectric element.

With the multi-layer piezoelectric element manufactured by the above procedure, the portions of green sheets 11 and 21 being sandwiched by the electrode layers 12 and 22 function as the active layers. Accordingly, the element contracts in the longitudinal direction when a voltage is applied to the electrodes.

As shown in FIG. 10, each of the electrode layers 12 and 22 is covered with the protective film 25 which is a monomolecular film. Owing to the protective film 25, moisture can be prevented from entering the active part, thus high reliability is assured even in a high temperature and high humidity environment. In addition, since the protective film 25 is a monomolecular film, the thickness of the film is the thickness equivalent to a single molecule layer. As a result, the protective film 25 has no power to restrict the displacement of the multi-layer piezoelectric element. Furthermore, there is no protective film 25 on top face and bottom face of the multi-layer piezoelectric element so that, on fabricating the Head Gimbal Assembly, no adverse effect appears on the adhesion of the multi-layer piezoelectric substrate to the suspension and the slider. Since, further, also the electrodes 23 are exposed, the connection with wiring is readily established.

As described above, the embodiment assures high reliability of the multi-layer piezoelectric element in a high temperature and high humidity environment on applying thereof to a magnetic disk unit without inducing adverse effect.

In addition, on forming the protective film 25, (joining the parfluoropolyether with the multi-layer piezoelectric substrate), other high energy beam than the Xenon excimer laser may be adopted. To selectively form the protective film 25, however, it is preferred to use Xenon excimer laser, electron beam and the like which can easily control the irradiating zone.

Figure 11:
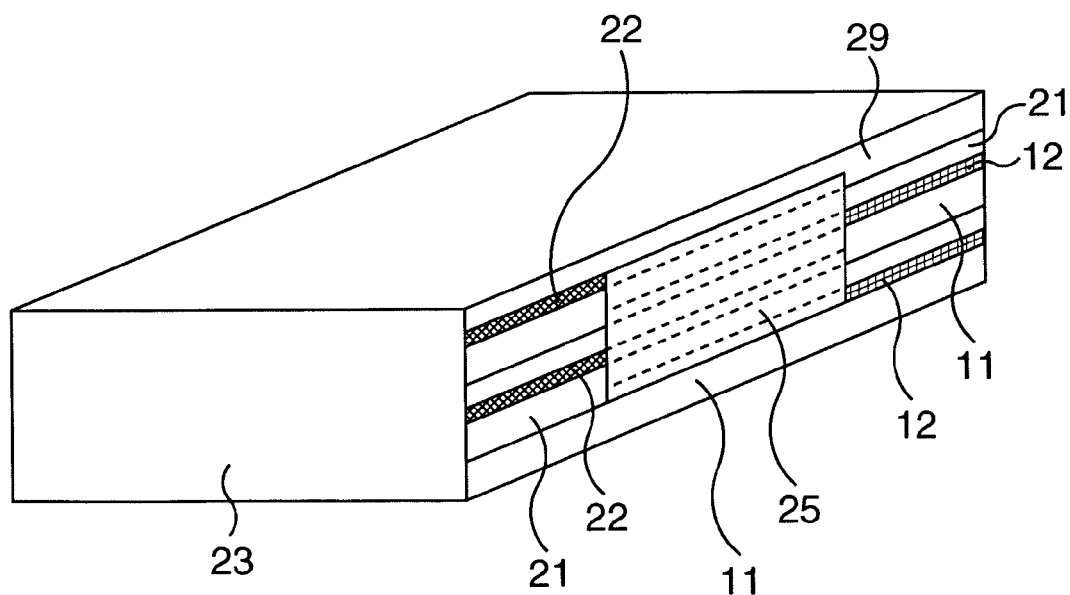
FIG. 11 shows a perspective view of a modified example of an embodiment of the present invention.

Further, according to the embodiment, the protective film 25 is formed over the whole area of side faces of the multi-layer piezoelectric substrate. As shown in FIG. 11, however, the protective film 25 may be formed to cover only the active layers and the electrode layers sandwiching the active layers, on side face of stacked layers. With such a structure, the restriction by the protective film 25 becomes further small. If the monomolecular film is adopted, the protective film may be formed over the whole surface area of Head Gimbal Assembly (HGA).

Incidentally, the embodiment adopts total four electrode layers. For applying the multi-layer piezoelectric substrate to a head actuator of magnetic disk unit, however, about 7 to 10 layers are preferred. It is also preferable that the substrate has about 1 mm in length in the longitudinal direction and about 100 to 200 μm in width.

Here, a determination result will be described; the inventors of the present invention determined the insulation resistance on a multi-layer piezoelectric element which was fabricated conforming to the embodiment. The determination identified the relation between the working time and the insulation resistance in an environment in which temperature was 80° C. and humidity was 80%. An electric field having an intensity of 1.5 V/μm was applied by continuously applying a direct current voltage of 60 V. For comparison, the determination was given also on a multi-layer piezoelectric element not forming the protective film 25 thereon. The result is given in FIG. 12. To confirm the reproducibility, the determination was given to the three pieces of multi-layer piezoelectric element for all the conditions (presence/absence of protective film 25).

Figure 12:
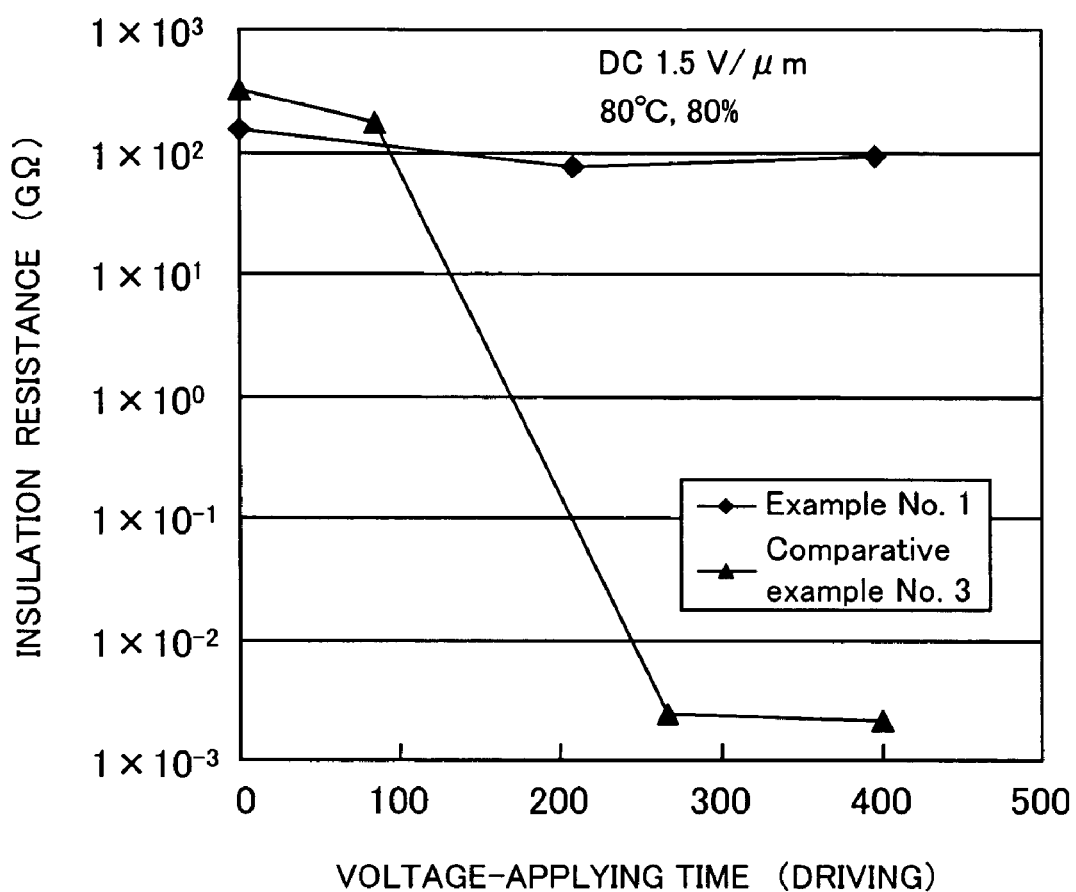
FIG. 12 is a graph giving the relation between the working time and the insulation resistance of multi-layer piezoelectric elements.

As shown in FIG. 12, the multi-layer piezoelectric element (Example No. 1) fabricated conforming to the embodiment gave about 100 GΩ of insulation resistance for all the three samples even after applying the voltage for 450 hours, showing very little fluctuations before and after the voltage application. To the contrary, the multi-layer piezoelectric element (Comparative Example No. 3). having no protective film 25, which showed 300 GΩ or higher insulation resistance before applying voltage, significantly decreased in the insulation resistance after applying the voltage for 250 hours down to about 2.5 MΩ on all the three samples. Furthermore, after applying the voltage for 450 hours, all the tested samples generated dielectric breakdown.

The inventors of the present invention also determined the insulation resistance on a single-layer piezoelectric element. For the determination, three kinds of samples were prepared.

Figure 13A:
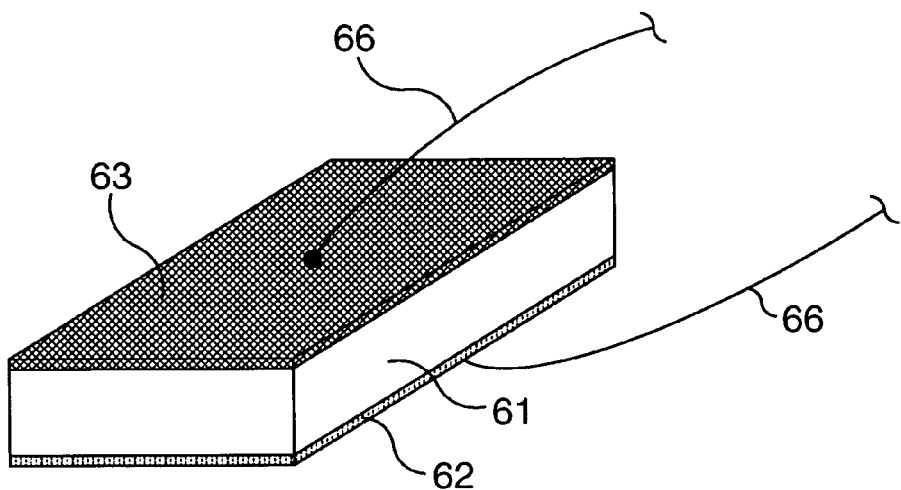
FIG. 13A shows a perspective view of a first sample.

First sample (Comparative Example No. 4) formed electrodes 62 and 63 on the respective sides of the green sheet 61 having a thickness of 150 μm, as shown in FIG. 13A. A lead wire 66 was connected to each of the electrodes 62 and 63. The structure of the green sheet 61 and the electrodes 62 and 63 is the same as that used in the above embodiment.

Figure 13B:
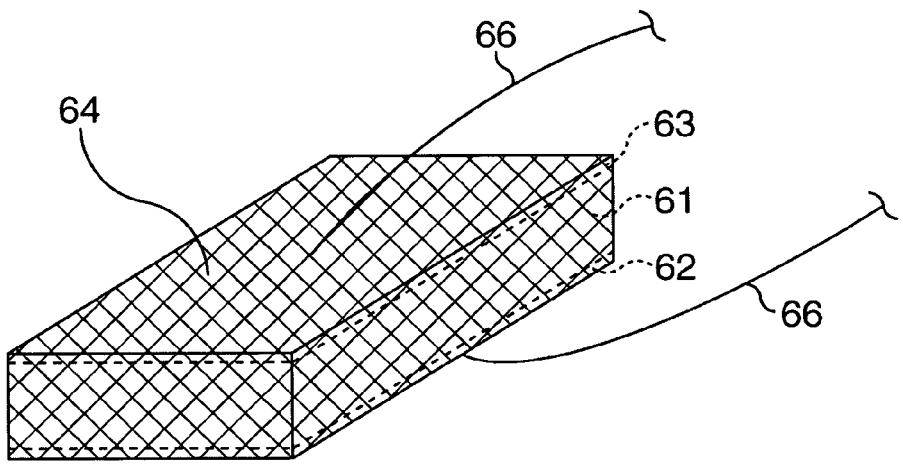
FIG. 13B shows a perspective view of a second sample.

Second sample (Comparative Example No. 5) formed a resin protective film 64 having about 10 μm in thickness over the whole surface area of the first sample, where lead wires 66 were connected to the respective electrodes 62 and 63, as shown in FIG. 13B. The resin protective film 64 was formed by coating and drying a fluorine-based film thereon.

Figure 13C:
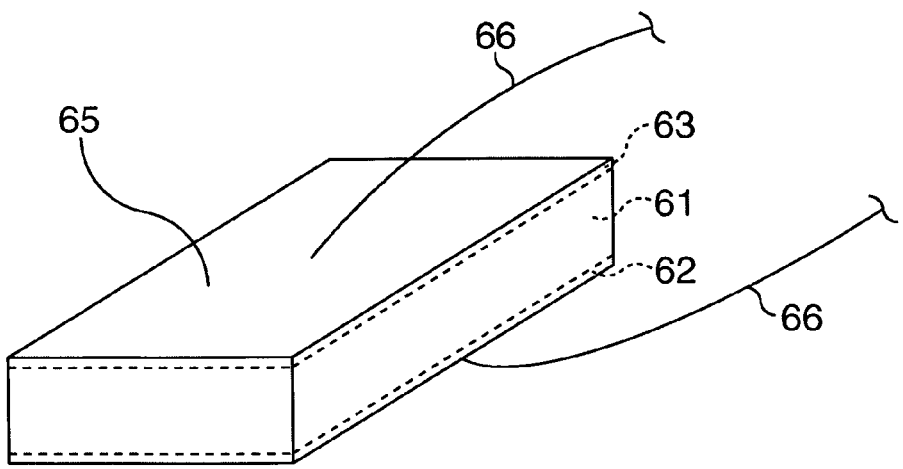
FIG. 13C shows a perspective view of a third sample.

Third sample (Example No. 2) formed a monomolecular protective film 65 having about 1 nm (10 Å) in thickness over the whole surface area of the first sample, where the lead wires 66 were connected to the respective electrodes 62 and 63, as shown in FIG. 13C. The monomolecular protective film 65 was formed by the procedure conforming to the one for forming the protective film 25 in the above embodiment.

Figure 14:
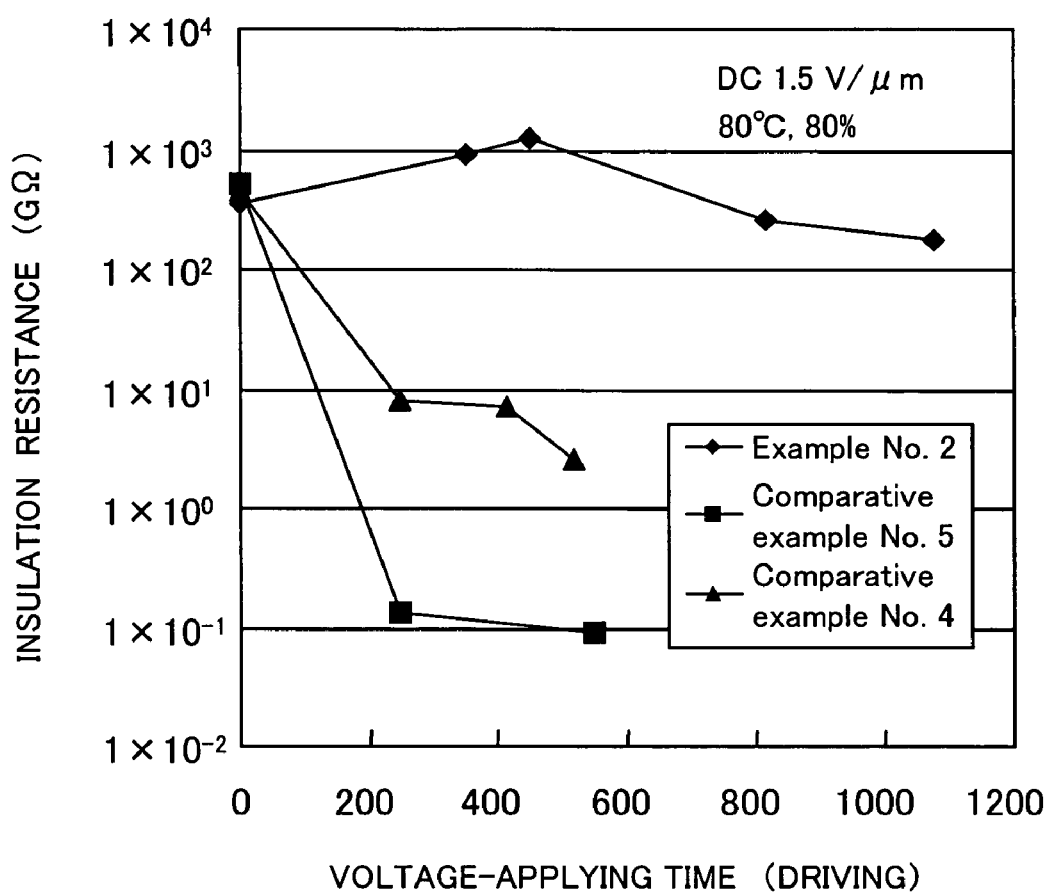
FIG. 14 is a graph giving the relation between the working time and the insulation resistance of single-layer piezoelectric elements.

The relation between the working time and the insulation resistance was determined in an environment in which temperature was 80° C. and humidity was 80%. An electric field having an intensity of 1.5 V/μm was applied by continuously applying a direct current voltage of 225 V. The result is shown in FIG. 14. To confirm the reproducibility, the determination was given to the three pieces of multi-layer piezoelectric element for all the conditions.

As shown in FIG. 14, the single-layer piezoelectric element (Example No. 2) having the formed monomolecular protective film 65 maintained 300 GΩ or higher insulation resistance for all the three samples even after applying the voltage for 500 hours, showing very little fluctuations before and after the voltage application. To the contrary, the single-layer piezoelectric element (Comparative Example No. 5) having the formed resin protective film 64, which showed 300 GΩ or higher insulation resistance before applying the voltage, significantly decreased in the insulation resistance after applying the voltage for 200 hours down to 1 GΩ or below on all the three samples. Furthermore, after applying the voltage for 600 hours, all the tested samples generated dielectric breakdown. With the single-layer piezoelectric element (Comparative Example No. 4) on which no monomolecular protective film 65 and no resin protective film 64 were formed, all the three samples which showed 300 GΩ or higher insulation resistance before applying the voltage significantly decreased in the insulation resistance after applying the voltage for 200 hours down to about 10 GΩ. Furthermore, after applying the voltage for 600 hours, all the samples generated dielectric breakdown.

Figure 15:
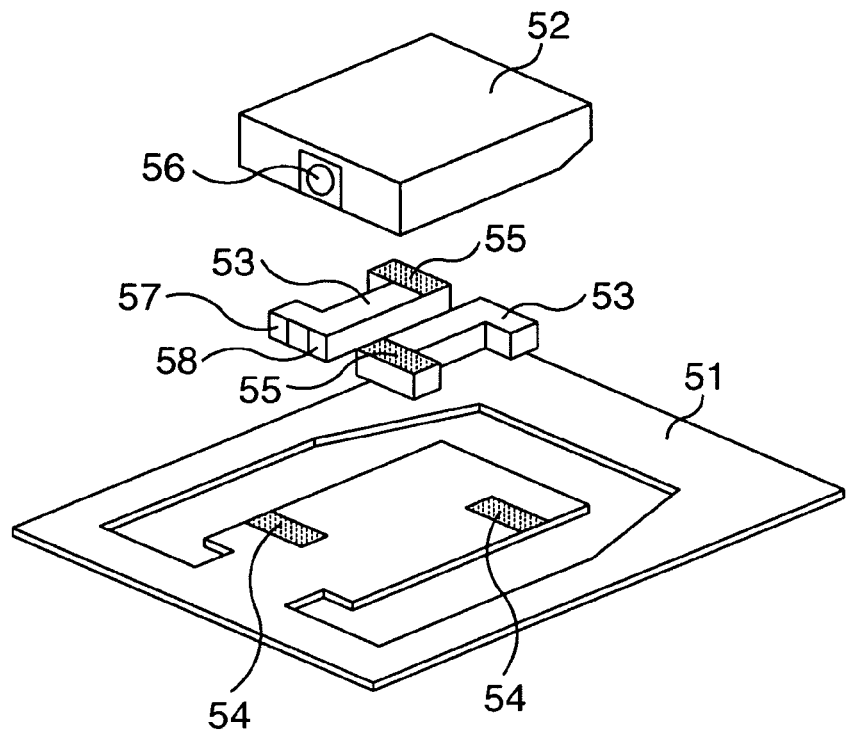
FIG. 15 shows a disassembled perspective view giving an example of HGA provided with a piezoelectric actuator according to an embodiment of the present invention.

The following is the description about Head Gimbal Assembly (HGA) using the piezoelectric actuator of the magnetic disk unit provided with above multi-layer piezoelectric element. FIG. 15 is a disassembled perspective view illustrating an example of HGA provided with the piezoelectric actuator according to the embodiment of the present invention.

As shown in FIG. 15, the HGA adopts piezoelectric elements 53 as two pieces of multi-layer structures. A surface of each one of the piezoelectric elements 53 is attached to a suspension 51 via an adhesive 54. The two pieces of piezoelectric elements 53 are placed in parallel to each other, while the respective edge parts adhered to the suspension 51 are placed opposite to each other. The flat plane of each piezoelectric element 53 is in angular U-shape. The piezoelectric elements 53 are positioned so as the active parts of them to closely approach with each other, while the projections at both edges of one element extend in opposite direction from the respective projections of another element.

On the other surface of each piezoelectric element 53, a slider 52 is attached via an adhesive 55. The adhesive 55 is applied on an edge part opposite to the adhesive 54 in each piezoelectric element 53. The slider 52 is provided with a magnetic head 56.

In thus fabricated HGA having a piezoelectric actuator, the piezoelectric element 53 extends in linear pattern when no voltage is applied to the piezoelectric element 53. When a voltage is applied, however, each piezoelectric element 53 tends to contract. In that case, both the piezoelectric elements 53 warp inward, not linearly contracting, caused by a mutual restriction force. As a result, the slider 52 rotates relative to the suspension 51. Consequently, by controlling the voltage applying to the piezoelectric element 53, very small rotational degree of the slider 52 can be controlled, thereby allowing the magnetic head 56 to move to the desired position.

Actually, when the inventors of the present invention fabricated the HGA given in FIG. 15, no defect such as insufficient adhesion was generated. A displacement measurement was given to the HGA using laser Doppler method, and a favorable result was attained, giving 1 μm of displacement of the magnetic head 56 at 20 V of applying voltage. The number of the electrode layers for the measurement was seven.

Figure 16A:
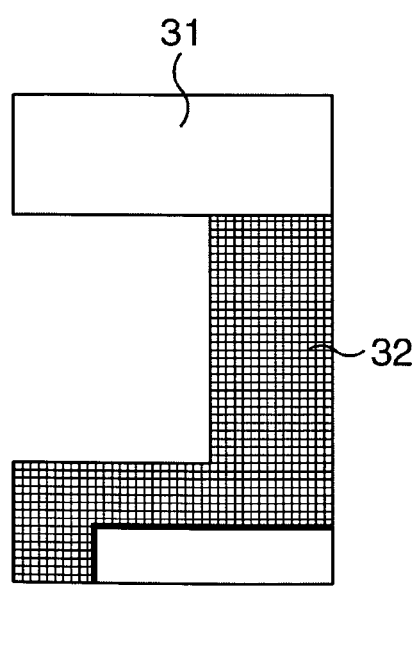
FIG. 16A and FIG. 16B show plane views illustrating a layout of electrode layers 32 and 42.
Figure 16B:
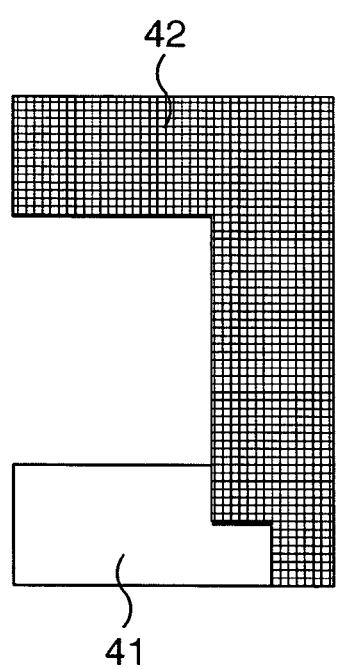
Figure 17:
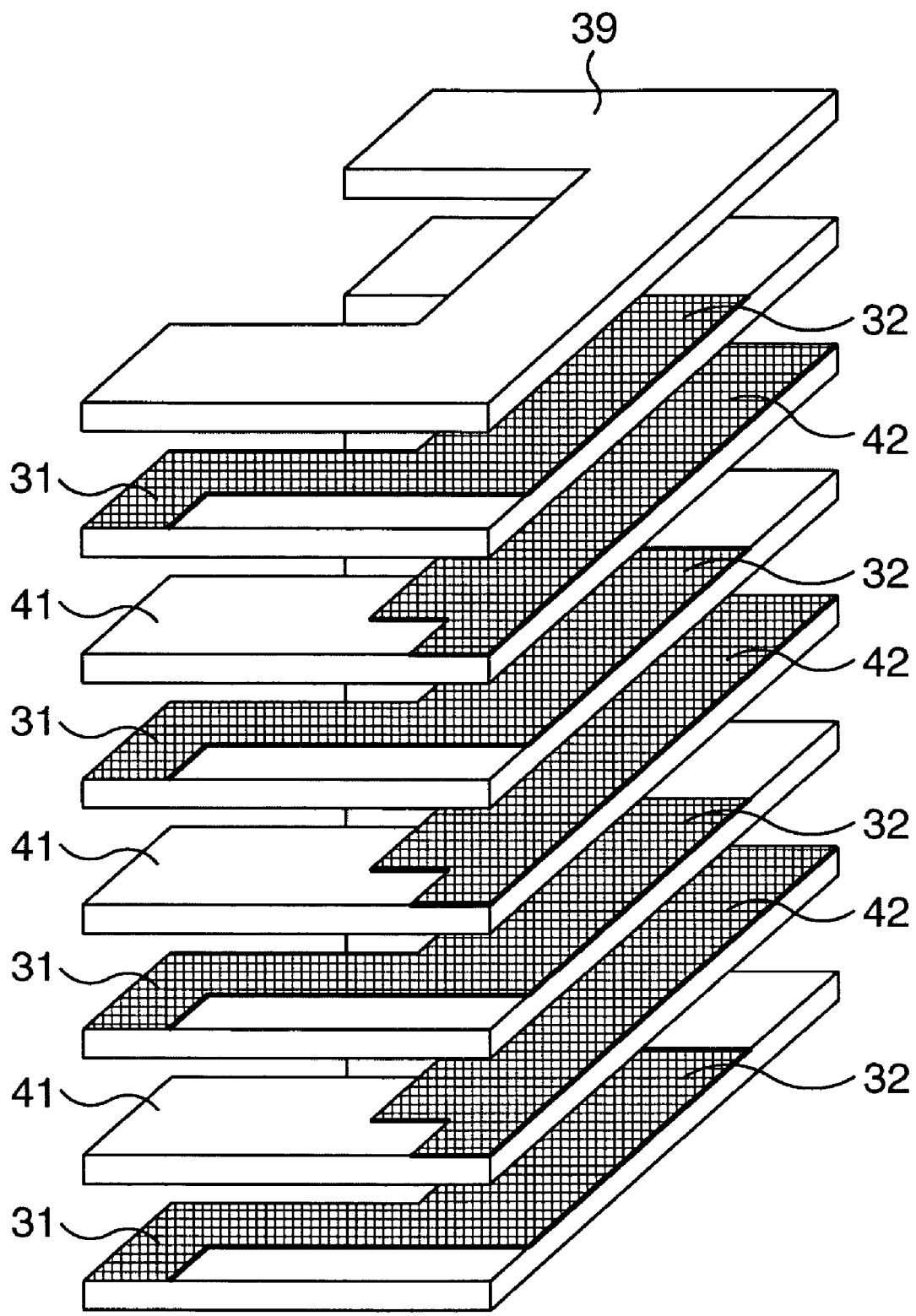
FIG. 17 shows a disassembled perspective view illustrating a layout of the electrode layers 32 and 42.

According to the embodiment, formation of the piezoelectric element for HGA adopted the layouts shown in FIGS. 15 to 17. That is, there are positioned two adhesion parts (portions to apply the adhesive 54 or 55) sandwiching the active layers. The adhesion part which adheres to the suspension forms an electrode 57, which connects the electrode layers 32 with each other, and an electrode 58, which connects the electrode layers 42 with each other, while the adhesion part adhered to the slider 52 has no extraction electrode.

If the electrode 57 or 58 is formed at the adhesion part which adheres to the slider 52, the adhesion part is not fixed to the suspension 51 so that the connection of the part with wiring is difficult. To the contrary, adoption of the above layouts readily allows the connection between wirings formed on the suspension 52 and the electrodes 57 and 58. In addition, since the positions for forming the electrodes 57 and 58 are close with each other, an effect of easily connecting them with wirings is also attained.

Figure 18:
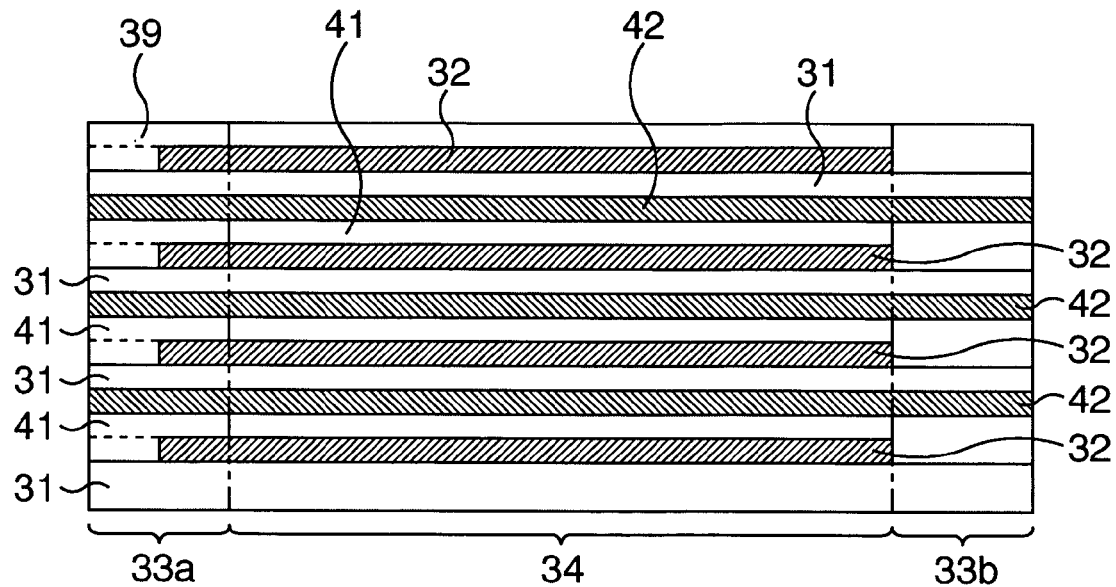
FIG. 18 shows a cross sectional view illustrating an internal layout of piezoelectric element.
Figure 19A:
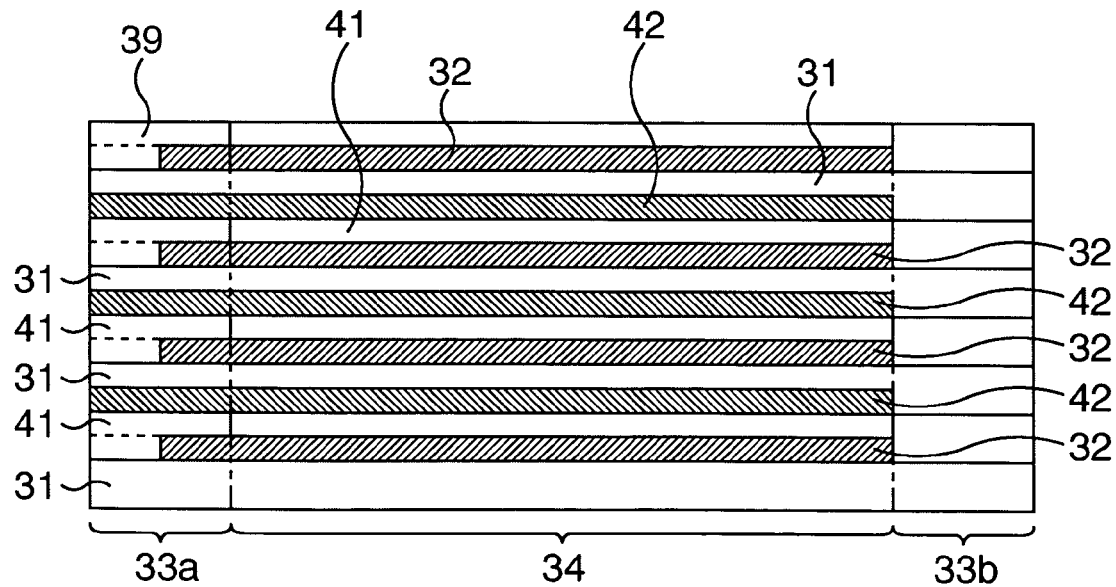
FIG. 19A shows a cross sectional view illustrating an internal layout of another example of piezoelectric element.

According to the above layout, as shown in the cross sectional view of FIG. 18, the electrode layer 42 extends from an adhesion part 33a adhering to the suspension 51 to an adhesion part 33b adhering to the slider 52. To perform the function of the piezoelectric element while adopting the above layouts relating to the electrodes, it is sufficient that an electrode layer 42 extends from one adhesion part 33a to an active part 34, as shown in FIG. 19A. The reason to adopt the layout extending to the adhesion part 33b is the following.

Figure 19B:
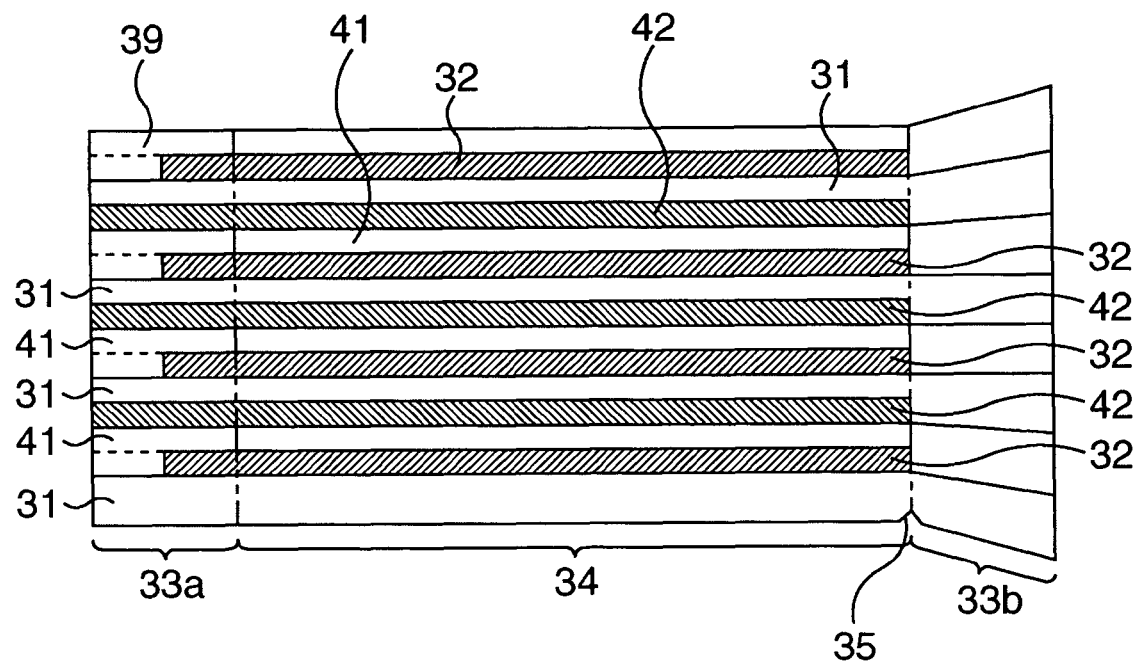
FIG. 19B shows a cross sectional view illustrating a defect which may appear when the internal layout shown in FIG. 19A is adopted.
Figure 20:
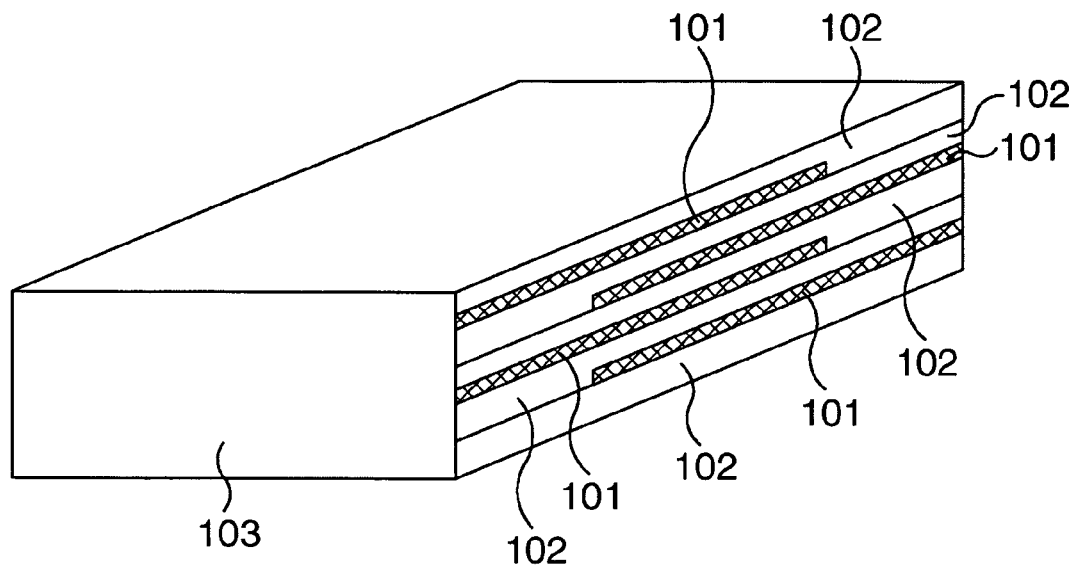
FIG. 20 shows a perspective view illustrating a conventional piezoelectric element.
Figure 21:
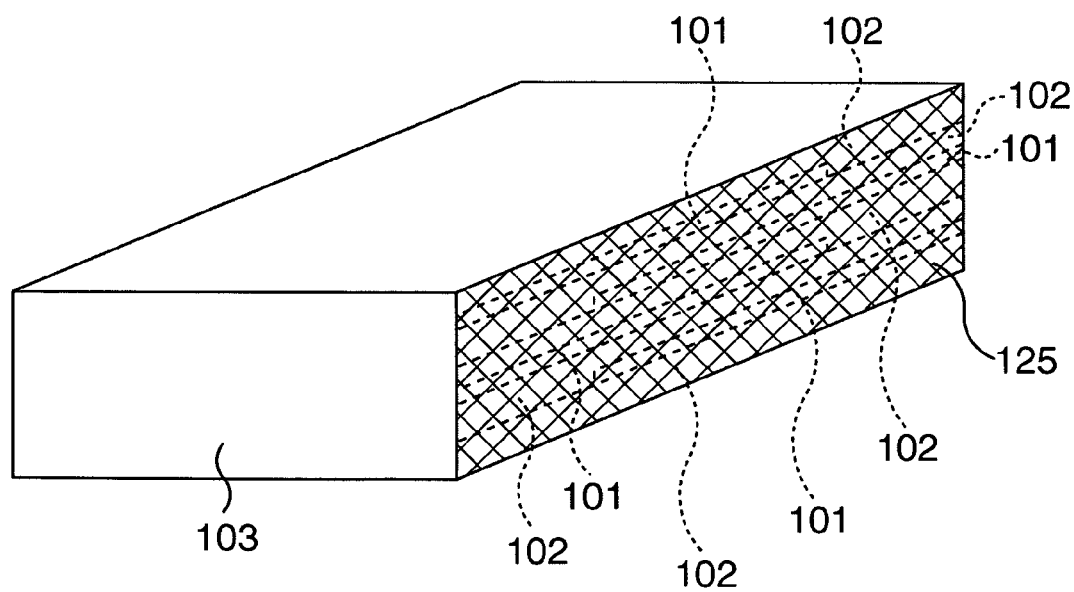
FIG. 21 shows a perspective view illustrating other conventional piezoelectric element.

That is, there is a difference in shrinkage ratio between the electrode layers 32 and 42 and the green sheets 31, 41 and 39. Consequently, as shown in FIG. 19A, when the electrode layer is absent in the adhesion part 33b, a variation in the thickness appears after sintering, as shown in FIG. 19B, resulting in difficulty to maintain the slider 52 in horizontal position. In addition, a crack 35 may occur at the connection part between the adhesion part 33b and the active part 34.

On the other hand, to avoid such a defect caused by the differences in shrinkage ratio, it is conceivable that the electrode layers 32 and 42 be extended over the whole surface area. In this case, however, the adhesion part 33b also contracts accompanied with the voltage application, thereby inducing unnecessary changes of the position of slider 52.

Consequently, on forming HGA, it is preferred to adopt the layouts shown in FIGS. 15 to 17.

According to the present invention, the monomolecular protective film assures high reliability even in high temperature and high humidity environments. In addition, the monomolecular protective film does not restrict the motion of the piezoelectric element. Furthermore, on assembling the magnetic disk unit, insufficient adhesion can be avoided.

What is claimed is:
1. A piezoelectric element comprising:
a body part structured by alternately stacking a plurality of first electrode layers and a plurality of second electrode layers, and sandwiching a plurality of active layers between the first and second electrode layers; and
a monomolecular protective film covering only a portion of a side surface of said body part, another portion of the side surface of said body being exposed from said monomolecular protective film, wherein said portion includes,
- all of first parts of said plurality of first electrode layers, said first parts existing directly above or directly beneath said plurality of second electrode layers in stacking direction;
- all of second parts of said plurality of second electrode layers, said second parts existing directly above or directly beneath said plurality of first electrode layers in stacking direction; and
- third parts of said plurality of active layers sandwiched by said first parts and second parts.

2. The piezoelectric element according to claim 1, wherein the plurality of active layers is constructed from a plurality of piezoelectric ceramic layers.

3. The piezoelectric element according to claim 1, wherein the monomolecular protective film contains a fluorinated hydrocarbon or a fluorinated polyether.

4. The piezoelectric element according to claim 1, wherein the monomolecular protective film contains a mixture of fluorinated hydrocarbon and fluorinated polyether.

5. The piezoelectric element according to claim 1, wherein the monomolecular protective film is composed of molecules having a basic structure of parfluoropolyether.

6. A piezoelectric actuator comprising:
- a base material;
- the piezoelectric element according to claim 1, fixed at one end thereof to the base material; and
- a driven member fixed to the other end of the piezoelectric element.

7. The piezoelectric actuator according to claim 6, wherein the piezoelectric element comprises:
- a first common electrode which connects the plurality of first electrode layers with each other; and
- a second common electrode which connects the plurality of second electrode layers with each other, the first and the second common electrodes being placed at an edge part being fixed to the base material.

8. The piezoelectric actuator according to claim 7, wherein one of the first electrode layer and the second electrode layer extends to an edge part fixed to the driven member.

9. The piezoelectric actuator according to claim 6, wherein the base material is a suspension, and the driven member is a slider provided with a magnetic head.

10. The piezoelectric element according to claim 1, wherein the monomolecular protective film bonds chemically with the side face by excimer laser irradiation.

* * * * *